United States Patent [19]
Chen et al.

[11] Patent Number: 6,108,258
[45] Date of Patent: Aug. 22, 2000

[54] SENSE AMPLIFIER FOR HIGH-SPEED INTEGRATED CIRCUIT MEMORY DEVICE

[75] Inventors: Juei-Lung Chen; Shin-Huang Huang; Hsin-Pang Lu, all of Hsinchu, Taiwan

[73] Assignee: United Integrated Circuits Corp., Hsinchu, Taiwan

[21] Appl. No.: 09/378,241

[22] Filed: Aug. 19, 1999

[51] Int. Cl.$^7$ .................................................. G11C 7/02
[52] U.S. Cl. ............................ 365/208; 365/205; 327/53; 327/54
[58] Field of Search .................................. 365/205, 207, 365/208; 327/52–57

[56] References Cited

U.S. PATENT DOCUMENTS

| | | | |
|---|---|---|---|
| 5,640,356 | 6/1997 | Gibbs | 365/207 |
| 5,661,691 | 8/1997 | Lin | 365/208 |
| 5,684,750 | 11/1997 | Kondoh et al. | 365/205 |
| 5,973,957 | 10/1999 | Tedrow | 365/205 |
| 5,982,690 | 11/1999 | Austin | 365/205 |

*Primary Examiner*—Son Mai
*Attorney, Agent, or Firm*—Hickman Stephens Coleman & Hughes, LLP

[57] ABSTRACT

A sense amplifier can be used with a high-speed IC memory device, which sense amplifier can help reduce the sensing latency during read operations to the memory device so as to allow fast access speed to the memory device. The sense amplifier includes a first-stage circuit, coupled to the bit lines of the memory device, for amplifying the differential data signal on the bit lines. Furthermore, a second-stage circuit has an input side coupled to receive the output signal from the first-stage circuit and an output side coupled to the bit lines, and is used for amplifying the output signal from the first-stage circuit and feeding the amplified signal back to the bit lines. The first-stage circuit and the second-stage circuit in combination constitute a positive feedback amplification loop coupled to the bit lines for amplifying the differential data signal on the bit lines to a detectable level. This positive feedback amplification loop allows the differential data signal on the bit lines to be quickly amplified to the detectable level with a reduced sensing latency, thus increasing the access speed to the associated memory device. Moreover, even though the bit lines are increased in length, the sensing speed is not significantly affected. This feature can also help save circuit layout space.

11 Claims, 1 Drawing Sheet

SENSE AMPLIFIER FOR HIGH-SPEED INTEGRATED CIRCUIT MEMORY DEVICE

BACKGROUND OF THE INVENTION

1. Field of the Invention

This invention relates to integrated circuit (IC) memory technology, and more particularly, to a sense amplifier for a high-speed IC memory device, which can help reduce the sensing latency during read operations to the memory device so as to allow fast access to the memory device.

2. Description of Related Art

The performance of a computer system is dependent on CPU speed as well as memory access speed. Therefore, the computer performance can be enhanced by increasing the memory access speed. At present, DRAM (Dynamic Random-Access Memory) is widely used as the primary memory in computer systems due to its high access speed. Newer types of DRAMs, such as FPM (Fast Page Mode) DRAM, EDO (Extended Data Out) DRAM, and SDRAM (Synchronized DRAM), can provide very high access speed.

It is well known that a DRAM device is typically coupled with a sense amplifier to its bit lines, which is used to amplify the differential data signal on the bit lines to an adequate level that can be detected by the memory interface coupled to the DRAM device.

The most widely used type of sense amplifier is the so-called latch-type sense amplifier. One drawback to this type of sense amplifier, however, is that its operation requires large sensing latency and large levels of differential data signal on the bit lines. Therefore, the latch-type sense amplifier is not suitable for use with a high-speed memory device.

FIG. 1 is a schematic diagram showing the circuit structure of a conventional sense amplifier.

As shown, the sense amplifier 10 is connected to a pair of complementary bit lines BL, BLB of a memory cell 1 10 of a memory device 100, and a pair of complementary data lines DL, DLB, and is composed of a pair of NMOS transistors 12, 14, and a pair of PMOS transistors 16, 18.

The circuit diagram of the sense amplifier 10 includes four nodes A, B, C, D, wherein the node A is connected via a third NMOS transistor 26 to the ground GND, the node B is connected to the bit line BL, the node C is connected to the bit line BLB, and the node D is connected via a third PMOS transistor 24 to the system voltage VCC.

The first NMOS transistor 12 is connected in such a manner that its drain is connected to the node A, its source is connected to the node B, and its gate is connected to the node C. The second NMOS transistor 14 is connected in such a manner that its drain is connected to the node A, its source is connected to the source of the second PMOS transistor 18, and its gate is connected to the node B. The first PMOS transistor 16 is connected in such a manner that its source is connected to the node B, its drain is connected to the node D, and its gate is connected to the node C. The second PMOS transistor 18 is connected in such a manner that its source is connected to the source of the second NMOS transistor 14, it drain is connected to the node D, and its gate is connected to the node B.

The sense amplifier 10 is used to amplify the differential data signal on the BL and BLB bit lines to a detectable level so that the data signals can be detected by the memory interface (not shown) connected to the data lines DL, DLB which are connected respectively via two NMOS transistors 20, 22 to the BL and BLB bit lines. A column select signal COL is used to control the ON/OFF states of these two NMOS transistors 20, 22.

Furthermore, the ON/OFF states of the third PMOS transistor 24 and the third NMOS transistor 26 are respectively controlled by a PSA (Positive Sense Active) signal and an NSA (Negative Sense Active) signal in such a manner that when the third PMOS transistor 24 is switched on by the PSA signal, it causes the node D to take on the system voltage VCC, and when the third NMOS transistor 26 is switched on by the NSA signal, it causes the node A to take on the ground voltage. The logic states of the PSA signal and the NSA signal are complementary to each other; i.e., when the NSA is at low-voltage logic state, the PSA signal is at high-voltage logic state, and vice versa. Furthermore, an NMOS transistor 28 is connected from the bit line BL to the bit line BLB, with its gate being connected to an equalizing signal EQ. When the equalizing signal EQ switches on the NMOS transistor 48, it causes the bit line BL and the bit line BLB to be equalized in voltage state.

One drawback to the forgoing sense amplifier of FIG. 1, however, is that the differential data signal on the BL and BLB bit lines should be relative large so that they can be detected by the sense amplifier, which would undesirably result in a large sensing latency that slows the access speed to the memory. This drawback makes the sense amplifier unsuitable for use with high-speed IC memory device.

SUMMARY OF THE INVENTION

It is therefore an objective of this invention to provide a sense amplifier for use with a high-speed IC memory device, which can help reduce the sensing latency so as to allow a fast memory access speed.

In accordance with the foregoing and other objectives, the invention proposes a new sense amplifier for use with high-speed IC memory device.

The sense amplifier of the invention includes a first-stage circuit, coupled to the bit lines of the memory device, for amplifying the differential data signal on the bit lines. The sense amplifier also includes and a second-stage circuit having an input side coupled to receive the output signal from the first-stage circuit and an output side coupled to the bit lines, for amplifying the output signal from the first-stage circuit and feeding the amplified signal back to the bit lines. The first-stage circuit and the second-stage circuit in combination constitute a positive feedback amplification loop coupled to the bit lines for amplifying the differential data signal on the bit lines to a detectable level.

The foregoing sense amplifier of the invention is characterized by the provision of a positive feedback amplification loop that allows the differential data signal on the bit lines to be quickly amplified to the detectable level with a reduced sensing latency, thus increasing the access speed to the associated memory device. Moreover, even though the bit lines are increased in length, the sensing speed is not significantly affected. This feature can also help save circuit layout space.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
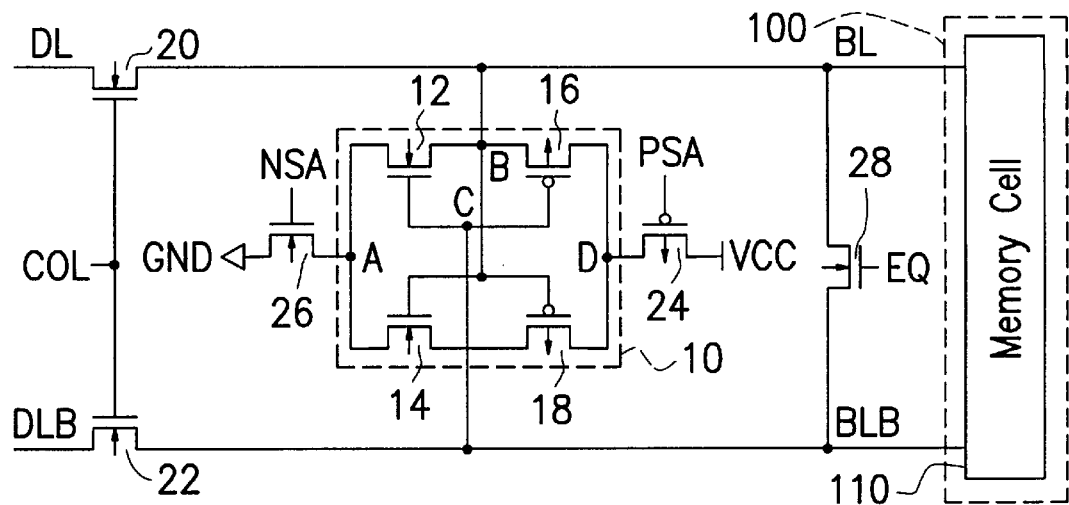
FIG. 1 (PRIOR ART) is a schematic diagram showing the circuit structure of a conventional sense amplifier.
Figure 2:
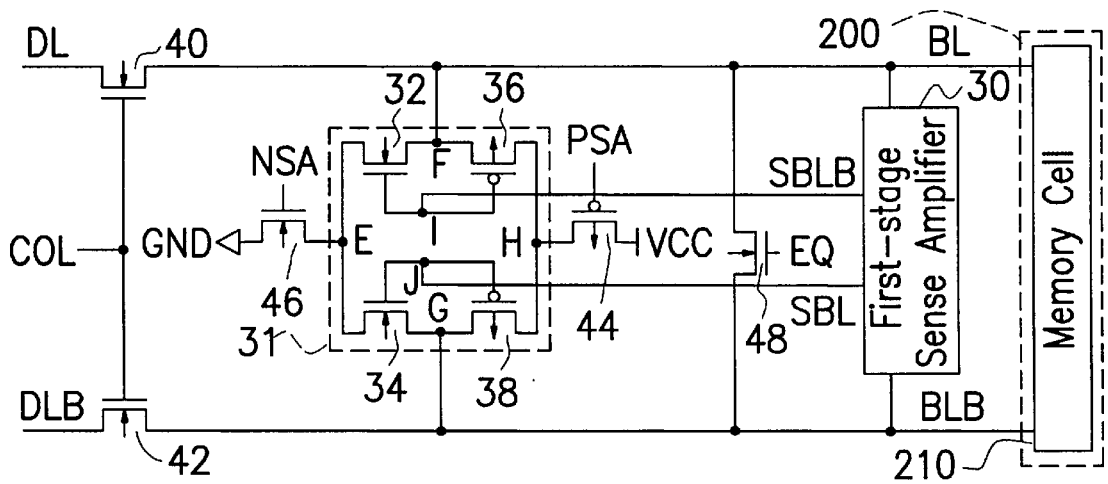
FIG. 2 is a schematic diagram showing the circuit structure of the sense amplifier according to the invention.
Figure 3:
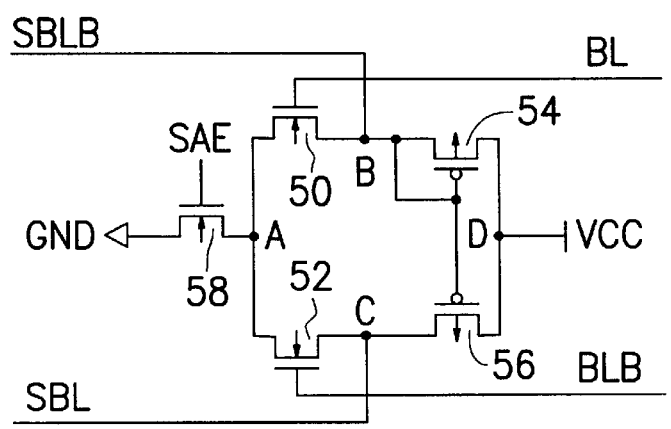
FIG. 3 is a schematic diagram showing the inside circuit structure of the first-stage circuit used in the sense amplifier of FIG. 2.

A preferred embodiment of the sense amplifier according to the invention is disclosed in the following with reference to FIGS. 2 and 3, wherein FIG. 2 is a schematic diagram showing the circuit structure of the sense amplifier according to the invention, and FIG. 3 is a schematic diagram showing the inside circuit structure of the first-stage circuit used in the sense amplifier of FIG. 2.

Referring first to FIG. 2, the sense amplifier of the invention is coupled to the BL and BLB bit lines connected to a memory cell 210 of memory device 200 such as an SDRAM device, and includes two stages: a first-stage circuit 30 and a second-stage circuit 31. The first-stage circuit 30 has two input lines connected respectively to the BL and BLB bit lines and two output lines respectively denoted by SBLB and SBL. The second-stage circuit 31 has two input lines connected respectively to the SBLB and SBL output lines of the first-stage circuit 30 and has two output lines respectively connected to the BL and BLB bit lines. This configuration forms a positive feedback amplification loop for the voltages on the BL and BLB bit lines. The first-stage circuit 30 can be either a high-gain sense amplifier or a complementary differential sense amplifier. FIG. 3 shows a detailed inside circuit structure for one example of the first-stage circuit 30.

As shown in FIG. 3, a preferred embodiment of the first-stage circuit 30 of the sense amplifier of the invention includes, for example, a pair of NMOS transistors 50, 52, and a pair of PMOS transistors 54, 56. The circuit diagram of the first-stage circuit 30 includes four nodes A, B, C, D, wherein the node A is connected via a third NMOS transistor 58 to the ground GND, the node B is connected to the output line SBLB, the node C is connected to the output line SBL, and the node D is connected to the system voltage VCC.

The first NMOS transistor 50 is connected in such a manner that its source is connected to the node A, its drain is connected to the node B, and its gate is connected to the bit line BL. The second NMOS transistor 52 is connected in such a manner that its source is connected to the node A, its drain is connected to the node C, and its gate is connected to the bit line BLB. The first PMOS transistor 54 is connected in such a manner that its source is connected to the node D, its drain is connected to the node B, and its gate is also connected to the node B. The second PMOS transistor 56 is connected in such a manner that its source is connected to the node D, its drain is connected to the node C, and its gate is connected to the node B.

The third NMOS transistor 58 is controlled by an SAE signal (Sense Active Enable) which can switch on the third NMOS transistor 58 when a read operation is initiated. When the third NMOS transistor 58 is switched on, it causes the node A to take on the ground voltage (i.e., a low-voltage logic state).

Referring back to FIG. 2, the second-stage circuit 31 is composed of a pair of NMOS transistors and a pair of PMOS transistors, i.e., a fourth NMOS transistor 32, a fifth NMOS transistor 34, a third PMOS transistor 36, and a fourth PMOS transistor 38. The circuit diagram of second-stage circuit 31 includes six nodes E, F, G, H, I, J, wherein the node E is connected via a sixth NMOS transistor 46 to the ground GND, the node F is connected to the bit line BL, the node G is connected to the bit line BLB, and the node H is connected via a fifth PMOS transistor 44 to the system voltage VCC, the node I is connected to the output line SBLB of the first-stage circuit 30, and the node J is connected to the output line SBL of the first-stage circuit 30.

The fourth NMOS transistor 32 is connected in such a manner that its drain is connected to the node E, its source is connected to the node F, and its gate is connected to the node I. The fifth NMOS transistor 34 is connected in such a manner that its drain is connected to the node E, its source is connected to the node G, and its gate is connected to the node J. The third PMOS transistor 36 is connected in such a manner that its source is connected to the node F, its drain is connected to the node H, and its gate is connected to the node I. The fourth PMOS transistor 38 is connected in such a manner that its source is connected to the node G, its drain is connected to the node H, and its gate is connected to the node J.

The bit line BL is connected via a seventh NMOS transistor 40 to the data line DL, while the bit line BLB is connected via an eighth NMOS transistor 42 to the complementary data line DLB. A column select signal COL is used to control the ON/OFF states of these two NMOS transistors 40, 42. A PSA signal and an NSA signal are used respectively to control the ON/OFF states of the fifth PMOS transistor 44 and the sixth NMOS transistor 46. The logic states of the PSA signal and the NSA signal are complementary to each other; i.e., when the PSA signal is at high-voltage logic state, the NSA is at low-voltage logic state, and vice versa. Furthermore, a ninth NMOS transistor 48 is connected from the bit line BL to the bit line BLB, with its gate being connected to an equalizing signal EQ. When the equalizing signal EQ switches on the NMOS transistor 48, it causes the bit line BL and the bit line BLB to be equalized in voltage state.

The operation of the sense amplifier of the invention is described in the following with reference to FIG. 2.

First, when the associated memory device (not shown) outputs the requested data in the form of a differential data signal on the BL and BLB bit lines, the differential data signal is first amplified by the first-stage circuit 30. The amplified signal is then transferred via the SBLB and SBL output lines to the second-stage circuit 31. In response, the second-stage circuit 31 amplifies the output signal from the first-stage circuit 30 and then feeds the amplified signal back to the BL and BLB bit lines. Repeatedly, the voltage signal on the BL and BLB bit lines are amplified by the first-stage circuit 30, next by the second-stage circuit 31, and next by the first-stage circuit 30, and so forth. This positive feedback amplification loop allows the original differential data signal on the BL and BLB bit lines to be quickly amplified to the detectable level with a reduced sensing latency, so that the output data from the associated memory device (not shown) can be quickly detected by the memory interface (not shown) connected to the DL and DLB data lines.

In conclusion, the invention provides a sense amplifier for use with a high-speed IC memory device, which is characterized by the provision of a positive feedback amplification loop that allows the differential data signal on the bit lines to be quickly amplified to the detectable level with a reduced sensing latency, thus increasing the access speed to the associated memory device. Moreover, even though the bit lines BL and BLB are increased in length, the sensing speed is not significantly affected.

Compared with the prior art, the sense amplifier of the invention has the following advantages.

First, the sense amplifier of the invention allows the differential data signal to be quickly amplified to the detectable level, thus increasing the access speed to the associated memory device as compared to the prior art.

Second, the sense amplifier of the invention is operable even when the voltage level of the original differential data signal on the BL and BLB bit lines is very small, thus allowing the use of a longer refresh time than allowed by the prior art.

Third, the use of the sense amplifier of the invention allows the bit lines to be increased in length but nevertheless allowing high access speed.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A sense amplifier for use with a memory device, which sense amplifier comprises:

a first-stage circuit, coupled to a plurality of bit lines of the memory device, for amplifying differential data signals on the bit lines; and a second-stage circuit having an input side coupled to receive output signals from the first-stage circuit and an output side coupled to the bit lines, for amplifying the output signals from the first-stage circuit and feeding the amplified signals back to the bit lines;

wherein the first-stage circuit and the second-stage circuit in combination constitute a positive feedback amplification loop coupled to the bit lines for amplifying the differential data signals on the bit lines to a detectable level.

2. The sense amplifier of claim 1, wherein the first-stage circuit has a first node, a second node, a third node, and a fourth node, and includes a first NMOS transistor, a second NMOS transistor, a third NMOS transistor, a first PMOS transistor, and a second PMOS transistor;

wherein
      the first node is connected via the third NMOS transistor to the ground, the second node serves as a first output end of the first-stage circuit, the third node serves as a second output end of the first-stage circuit, and the fourth node is connected to a system voltage;

and wherein
      the first NMOS transistor is connected in such a manner that its source is connected to the first node, its drain is connected to the second node, and its gate is connected to the first bit line of the memory device;
      the second NMOS transistor is connected in such a manner that its source is connected to the first node, its drain is connected to the third node, and its gate is connected to the second bit line;
      the first PMOS transistor is connected in such a manner that its source is connected to the fourth node, its drain is connected to the second node, and its gate is also connected to the second node;
      the second PMOS transistor is connected in such a manner that its source is connected to the fourth node, its drain is connected to the third node, and its gate is connected to the second node; and
      the third NMOS transistor is connected in such a manner that its source is connected to the first node, its drain is connected to the ground, and its gate is connected to a Sense Active Enable signal.

3. The sense amplifier of claim 1, wherein the second-stage circuit has a fifth node, a sixth node, a seventh node, an eighth node, a ninth node, and a tenth node, and includes a fourth NMOS transistor, a fifth NMOS transistor, a sixth NMOS transistor, a third PMOS transistor, a fourth PMOS transistor, and a fifth PMOS transistor;

wherein
      the fifth node is connected via the sixth NMOS transistor to the ground, the sixth node is connected to the first bit line, the seventh node is connected to the second bit line, and the eighth node is connected via the fifth PMOS transistor to the system voltage, the ninth node is connected to the first output line of the first-stage circuit, and the tenth node is connected to the second output line of the first-stage circuit;

and wherein
      the fourth NMOS transistor is connected in such a manner that its drain is connected to the fifth node, its source is connected to the sixth node, and its gate is connected to the ninth node;
      the fifth NMOS transistor is connected in such a manner that its drain is connected to the fifth node, its source is connected to the seventh node, and its gate is connected to the tenth node;
      the third PMOS transistor is connected in such a manner that its source is connected to the sixth node, its drain is connected to the eighth node, and its gate is connected to the ninth node;
      the fourth PMOS transistor is connected in such a manner that its source is connected to the seventh node, its drain is connected to the eighth node, and its gate is connected to the tenth node;
      the sixth NMOS transistor is connected in such a manner that its source is connected to the fifth node, its drain is connected to the ground, and its gate is connected to a Negative Sense Active signal; and
      the fifth PMOS transistor is connected in such a manner that its source is connected to the eighth node, its drain is connected to the system voltage, and its gate is connected to a Positive Sense Active signal.

4. The sense amplifier of claim 2, wherein the Sense Active Enable switches on the third NMOS transistor when a read operation is initiated, causing the first node to take on the ground voltage.

5. The sense amplifier of claim 3, wherein the Negative Sense Active signal and the Positive Sense Active are complementary to each other in such a manner that when the Negative Sense Active is at low-voltage logic state, the Positive Sense Active is at high-voltage logic state.

6. The sense amplifier of claim 1, wherein the memory device is an SDRAM device.

7. A sense amplifier for use with a memory device having at least a first bit line and a second bit line for outputting a differential data signal representative of requested data, the sense amplifier comprising:

(a) a first-stage circuit, coupled to the bit lines of the memory device, for amplifying the differential data signal on the bit lines;

the first-stage circuit having a first node, a second node, a third node, and a fourth node, and including a first NMOS transistor, a second NMOS transistor, a third NMOS transistor, a first PMOS transistor, and a second PMOS transistor;

wherein the first node is connected via the third NMOS transistor to the ground, the second node serves as a first output end of the first-stage circuit, the third node serves as a second output end of the first-stage circuit, and the fourth node is connected to a system voltage;

and wherein the first NMOS transistor is connected in such a manner that its source is connected to the first node, its drain is connected to the second node, and its gate is connected to the first bit line of the memory device;

the second NMOS transistor is connected in such a manner that its source is connected to the first node, its drain is connected to the third node, and its gate is connected to the second bit line;

the first PMOS transistor is connected in such a manner that its source is connected to the fourth node, its drain is connected to the second node, and its gate is also connected to the second node;

the second PMOS transistor is connected in such a manner that its source is connected to the fourth node, its drain is connected to the third node, and its gate is connected to the second node; and the third NMOS transistor is connected in such a manner that its source is connected to the first node, its drain is connected to the ground, and its gate is connected to a Sense Active Enable signal;

(b) a second-stage circuit having an input side coupled to receive the output signal from the first-stage circuit and an output side coupled to the bit lines, for amplifying the output signal from the first-stage circuit and feeding the amplified signal back to the bit lines;

the second-stage circuit having a fifth node, a sixth node, a seventh node, an eighth node, a ninth node, and a tenth node, and including a fourth NMOS transistor, a fifth NMOS transistor, a sixth NMOS transistor, a third PMOS transistor, a fourth PMOS transistor, and a fifth PMOS transistor;

wherein the fifth node is connected via the sixth NMOS transistor to the ground, the sixth node is connected to the first bit line, the seventh node is connected to the second bit line, and the eighth node is connected via the fifth PMOS transistor to the system voltage, the ninth node is connected to the first output line of the first-stage circuit, and the tenth node is connected to the second output line of the first-stage circuit;

and wherein the fourth NMOS transistor is connected in such a manner that its drain is connected to the fifth node, its source is connected to the sixth node, and its gate is connected to the ninth node;

the fifth NMOS transistor is connected in such a manner that its drain is connected to the fifth node, its source is connected to the seventh node, and its gate is connected to the tenth node;

the third PMOS transistor is connected in such a manner that its source is connected to the sixth node, its drain is connected to the eighth node, and its gate is connected to the ninth node;

the fourth PMOS transistor is connected in such a manner that its source is connected to the seventh node, its drain is connected to the eighth node, and its gate is connected to the tenth node;

the sixth NMOS transistor is connected in such a manner that its source is connected to the fifth node, its drain is connected to the ground, and its gate is connected to a Negative Sense Active signal; and the fifth PMOS transistor is connected in such a manner that its source is connected to the eighth node, its drain is connected to the system voltage, and its gate is connected to a Positive Sense Active signal;

and wherein the first-stage circuit and the second-stage circuit in combination constitute a positive feedback amplification loop coupled to the bit lines for amplifying the differential data signal on the bit lines to a detectable level.

8. The sense amplifier of claim 7, wherein the Sense Active Enable switches on the third NMOS transistor when a read operation is initiated, causing the first node to take on the ground voltage.

9. The sense amplifier of claim 7, wherein the Negative Sense Active signal and the Positive Sense Active are complementary to each other in such a manner that when the Negative Sense Active is at low-voltage logic state, the Positive Sense Active is at high-voltage logic state.

10. The sense amplifier of claim 7, wherein the memory device is an SDRAM device.

11. A sense amplifier for use with a memory device, which sense amplifier comprises:

a first-stage circuit, coupled to a plurality of signal lines of the memory device, for amplifying differential data signals on the signal lines; and a second-stage circuit having an input side coupled to receive output signals from the first-stage circuit and an output side coupled to the signal lines, for amplifying the output signals from the first-stage circuit and feeding the amplified signals back to the signal lines;

wherein the first-stage circuit and the second-stage circuit in combination constitute a positive feedback amplification loop coupled to the signal lines for amplifying the differential data signals on the signal lines to a detectable level.

* * * * *